(12) United States Patent
Nesbit et al.

(10) Patent No.: US 10,518,483 B2
(45) Date of Patent: Dec. 31, 2019

(54) COMPOUND SHIMMING

(71) Applicant: The Boeing Company, Chicago, IL (US)

(72) Inventors: Ashleigh Nesbit, Williamstown (AU); Thomas Wilson, Beaumaris (AU)

(73) Assignee: The Boeing Company, Chicago, IL (US)

( * ) Notice: Subject to any disclaimer, the term of this patent is extended or adjusted under 35 U.S.C. 154(b) by 236 days.

(21) Appl. No.: 15/414,981

(22) Filed: Jan. 25, 2017

(65) Prior Publication Data

US 2018/0207884 A1    Jul. 26, 2018

(51) Int. Cl.
| | | |
|---|---|---|
| *B32B 41/00* | (2006.01) |
| *B29C 65/48* | (2006.01) |
| *B29C 65/00* | (2006.01) |
| *B23P 19/04* | (2006.01) |
| *G06F 17/50* | (2006.01) |

(Continued)

(52) U.S. Cl.
CPC .............. *B29C 65/48* (2013.01); *B23P 19/04* (2013.01); *B25J 9/1687* (2013.01); *B29C 66/01* (2013.01); *B64F 5/10* (2017.01); *G06F 17/50* (2013.01); *B23P 2700/01* (2013.01); *B23P 2700/12* (2013.01); *B29L 2031/3055* (2013.01); *B29L 2031/3076* (2013.01); *B29L 2031/3097* (2013.01); *B62D 65/02* (2013.01); *G05B 2219/40019* (2013.01); *G06F 17/5095* (2013.01)

(58) Field of Classification Search
CPC ........ B29C 65/48; B29C 66/01; B25J 9/1687; B64F 5/10; B64C 3/00; B64C 1/00; B23P 19/04; B23P 2700/01; B23P 2700/12; G06F 17/50; G06F 17/5095; G05B 2219/40019; B29L 2031/3055; B29L 2031/3076; B29L 2031/3097; B62D 65/02
USPC ................... 156/60, 64, 350, 351, 378, 379
See application file for complete search history.

(56) References Cited

U.S. PATENT DOCUMENTS

| | | |
|---|---|---|
| 4,526,641 A | 7/1985 | Schriever et al. |
| 5,191,693 A | 3/1993 | Umetsu |

(Continued)

FOREIGN PATENT DOCUMENTS

| | | |
|---|---|---|
| EP | 2813432 | 12/2014 |
| JP | H04-49121 | 2/1992 |
| WO | 2007034197 | 3/2007 |

OTHER PUBLICATIONS

Extended European Search Report for EP Patent Application No. 17206546.8 dated Jun. 18, 2018.

*Primary Examiner* — Michael N Orlando
*Assistant Examiner* — Joshel Rivera
(74) *Attorney, Agent, or Firm* — Kunzler Bean & Adamson (57) ABSTRACT

Disclosed herein is a method. The method includes identifying a first location on a first part to place a first shim tab to form a first portion of a compound shim. The method also includes applying the first shim tab to the first location on the first part with an end-effector. The method also includes identifying a second location directly adjacent to the first location on the first part to place a second shim tab. The method also includes applying the second shim tab to the second location on the first part with the end-effector to form a second portion of the compound shim. The method also includes applying a third shim tab to the second shim tab at (Continued)

the second location to increase a thickness of the second portion of the compound shim.

20 Claims, 5 Drawing Sheets (51) Int. Cl.
  *B64F 5/10* (2017.01)
  *B25J 9/16* (2006.01)
  *B29L 31/30* (2006.01)
  *B62D 65/02* (2006.01)

(56) References Cited

U.S. PATENT DOCUMENTS

| | | |
|---|---|---|
| 2006/0137140 A1 | 6/2006 | Christeson et al. |
| 2010/0280648 A1 | 11/2010 | March et al. |
| 2013/0266770 A1 | 10/2013 | Otto et al. |
| 2014/0367519 A1* | 12/2014 | Goehlich ................. B64C 1/00 244/119 |

* cited by examiner

COMPOUND SHIMMING

FIELD

This disclosure relates generally to component joining, and more particularly to joint shimming and filling.

BACKGROUND

Today, many complex structures, such as aircraft, spacecraft, automobiles, and the like, are made by assembling individual components. Those assembled materials include a significantly large number of interconnected components. The interconnected components of complex structures are connected together at joints. The joints of complex structures are traditionally formed using fasteners and weldments.

To improve the characteristics of joints, gaps between components are filled or shimmed to reduce the stresses and other forces experienced by the fasteners, weldments, and components of the structures. However, exact component geometries can vary making it difficult to fit a gap with prebuilt shims and fillers.

SUMMARY

The subject matter of the present application has been developed in response to the present state of the art, and in particular, in response to the shortcomings of traditional shimming and filling methods and systems, that have not yet been fully solved by currently available techniques. Accordingly, the subject matter of the present application has been developed to provide a shimming method, and associated systems, that overcome at least some of the above-discussed shortcomings of prior-art techniques.

Disclosed herein is a method. The method includes identifying a first location on a first part to place a first shim tab to form a first portion of a compound shim. The method also includes applying the first shim tab to the first location on the first part with an end-effector. The method also includes identifying a second location directly adjacent to the first location on the first part to place a second shim tab. The method also includes applying the second shim tab to the second location on the first part with the end-effector to form a second portion of the compound shim. The method also includes applying a third shim tab to the second shim tab at the second location to increase a thickness of the second portion of the compound shim. The preceding subject matter of this paragraph characterizes example 1 of the present disclosure.

The first shim tab and the second shim tab in the compound shim are separated by a gap less than a width of the first shim tab. The preceding subject matter of this paragraph characterizes example 2 of the present disclosure, wherein example 2 also includes the subject matter according to example 1, above.

The method further includes determining a surface characteristic of the first part. The preceding subject matter of this paragraph characterizes example 3 of the present disclosure, wherein example 3 also includes the subject matter according any one of examples 1-2, above.

The method further includes determining a surface characteristic of a second part to be joined to the first part and determining a geometry of the compound shim based on the surface characteristic of the first part and the surface characteristic of the second part. The preceding subject matter of this paragraph characterizes example 4 of the present disclosure, wherein example 4 also includes the subject matter according to example 3, above.

Applying the first shim tab further includes removing the first shim tab from a carrier material. The preceding subject matter of this paragraph characterizes example 5 of the present disclosure, wherein example 5 also includes the subject matter according to any one of examples 1-4, above.

The method further includes separating the first shim tab from the second shim tab during the application of the first shim tab to the first location with the end-effector. The preceding subject matter of this paragraph characterizes example 6 of the present disclosure, wherein example 6 also includes the subject matter according to any one of examples 1-5, above.

Applying the first shim tab includes adhering the first shim tab to the first part with an adhesive. The preceding subject matter of this paragraph characterizes example 7 of the present disclosure, wherein example 7 also includes the subject matter according to any one of examples 1-6, above.

Also disclosed herein is an apparatus. The system includes a supply structure and an applicator. The supply structure carries a first shim tab, a second shim tab, and a third shim tab. The applicator is to receive the first shim tab from the supply structure, apply the first shim tab to a first location on a part, receive the second shim tab from the supply structure, apply the second shim tab to a second location directly adjacent to the first location on the part to for a compound shim, receive the third shim tab from the supply structure, and apply the third shim tab to the second shim tab at the second location. The preceding subject matter of this paragraph characterizes example 8 of the present disclosure.

The apparatus further includes a collection structure to collect a carrier material. The preceding subject matter of this paragraph characterizes example 9 of the present disclosure, wherein example 9 also includes the subject matter according to example 8, above.

At least one of the supply structure and the collection structure includes a spool. The preceding subject matter of this paragraph characterizes example 10 of the present disclosure, wherein example 10 also includes the subject matter according to example 9, above.

Applying the first shim tab, the second shim tab, and the third shim tab includes separating the first shim tab, the second shim tab, and the third shim tab from a carrier material. The preceding subject matter of this paragraph characterizes example 11 of the present disclosure, wherein example 11 also includes the subject matter according to any one of examples 8-10, above.

Applying the first shim tab include separating the first shim tab from the second shim tab. The preceding subject matter of this paragraph characterizes example 12 of the present disclosure, wherein example 12 also includes the subject matter according to any one of examples 8-11, above.

A control module to control delivery of the first shim tab, the second shim tab, and the third shim tab to the applicator. The preceding subject matter of this paragraph characterizes example 13 of the present disclosure, wherein example 13 also includes the subject matter according to any one of examples 8-12, above.

Applying the third shim tab to the second shim tab increases the thickness of the compound shim at the second location. The preceding subject matter of this paragraph characterizes example 14 of the present disclosure, wherein example 14 also includes the subject matter according to any one of examples 8-13, above.

At least two of the first shim tab, the second shim tab, and the third shim tab have a uniform geometry to facilitate a tessellated pattern on the part. The preceding subject matter of this paragraph characterizes example 15 of the present disclosure, wherein example 15 also includes the subject matter according to any one of examples 8-14, above.

Applying the first shim tab, the second shim tab, and the third shim tab includes separating the first shim tab, the second shim tab, and the third shim tab from a carrier material. The preceding subject matter of this paragraph characterizes example 16 of the present disclosure, wherein example 16 also includes the subject matter according to any one of examples 8-15, above.

Also disclosed is a system. The system includes an assembly jig, an inspection module, a control module, a multi-axis arm, and an end-effector. The assembly jig is to secure a first part. The inspection module is to generate inspection data describing a surface characteristic of at least the first part at a joining region where the first part is to be joined with a second part. The control module is to generate a compound shim plan corresponding to the joining region of the first part based on the inspection data. The multi-axis arm is to more relative to the assembly jig in response to input from the control module. The end-effector is coupled to the multi-axis arm to receive a first shim tab at an applicator of the end-effector, align the applicator with the joining region on the first part, apply the first shim tab to the joining region of the first part at a first location of the compound shim plan with the applicator, receive a second shim tab at the applicator of the end-effector, apply the second shim tab to the joining region of the first part at a second location of the compound shim plan with the applicator, the second shim tab forming a pattern with the first shim tab, receive a third shim tab at the applicator of the end-effector, and apply the third shim tab to the second shim tab at the second location of the compound shim plan with the applicator to increase a thickness at the second location according to the compound shim plan. The preceding subject matter of this paragraph characterizes example 17 of the present disclosure.

The inspection module is further to monitor the application of the first shim tab to adjust the application of the second shim tab. The preceding subject matter of this paragraph characterizes example 18 of the present disclosure, wherein example 18 also includes the subject matter according to example 17, above.

The control module is further to control delivery of the first shim tab, the second shim tab, and the third shim tab to the applicator. The preceding subject matter of this paragraph characterizes example 19 of the present disclosure, wherein example 19 also includes the subject matter according to any one of examples 17-18, above.

The joining region includes a fastener location to facilitate a fastener to join the first part with the second part. The preceding subject matter of this paragraph characterizes example 20 of the present disclosure, wherein example 20 also includes the subject matter according to any one of examples 17-19, above.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Embodiments described below relate to forming a compound shim by placing shim tabs on a part at a joining region (where two parts may or are designed to meet). The compound shim can be adapted in footprint (e.g., size) and thickness to provide a variety of shimming sizes and shapes (e.g., 3-dimensional shapes) by changing the number of shim tabs applied to the part, the spacing/pattern of the shim tabs, and the stacking depth of the shim tabs. Other embodiments are described below with respect to the several Figures.

Figure 1:
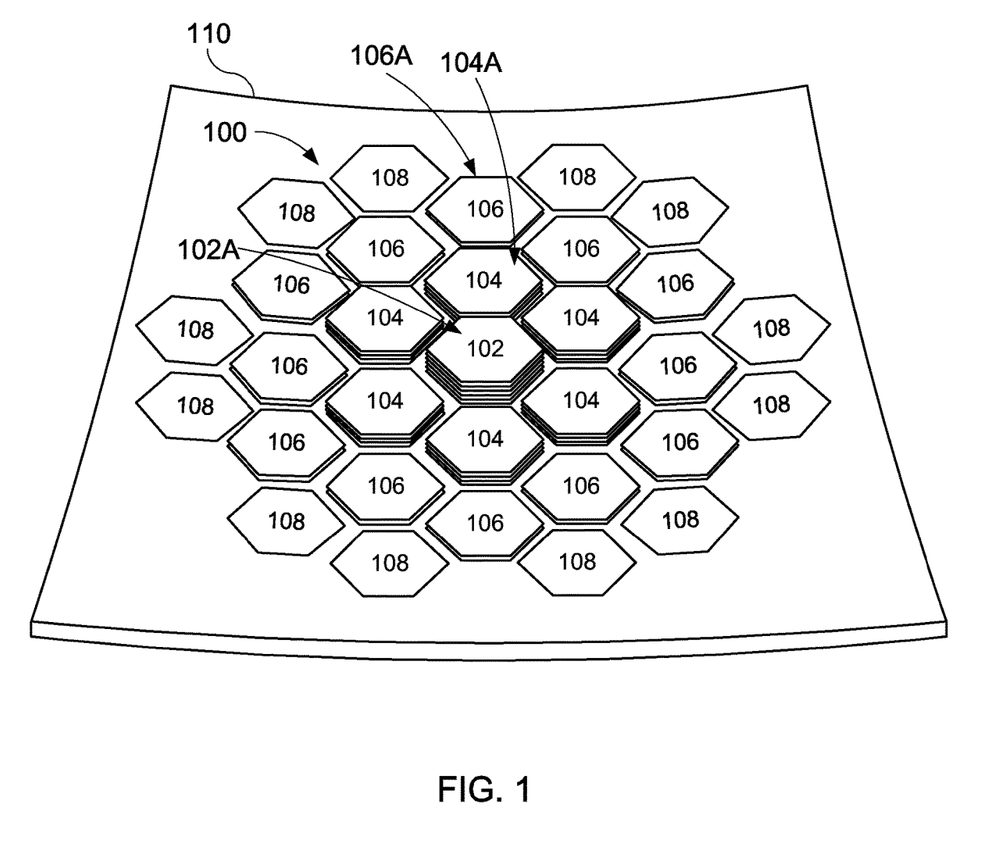
FIG. 1 is a schematic perspective view of a compound shim, according to one or more examples of the present disclosure.

The illustrated embodiment of FIG. 1 includes a plurality of shim tabs 102-108 that form a compound shim 100 applied to a part 110 (also referred to below as a "first part 110"). In some embodiments, each of the shim tabs 102-108 have the same geometry. In the illustrated implementation, the shim tabs 102-108 have a hexagonal geometry. In other implementations, the shim tabs 102-108 have a regular or irregular non-hexagonal geometry (e.g., triangular).

In some embodiments, the shim tabs 102-108 are phenolic shim tabs. In other embodiments, the shim tabs 102-108 include one or more metallic, ceramic, plastic, or other synthetic or natural materials.

Each of the shim tabs 102-108 has a thickness. In some embodiments, the shim tabs 102-108 have a thickness of approximately three-thousandths of an inch (i.e. 0.003 inches). In other embodiments, the shim tabs 102-108 are thicker or thinner than three-thousandths of an inch. In some embodiments, the thickness of each shim tab 102-108 is uniform. In other embodiments, at least one of the shim tabs 102-108 has a non-uniform thickness. In some embodiments, the shim tabs 102-108 have a generic shape and the same thickness. In other embodiments, one or more of the shim tabs 102-108 has a thickness different from another of the shim tabs 102-108.

In the illustrated embodiment, each of the shim tabs 102-108 are layered to a corresponding depth or thickness. The middle stack 102A of shim tabs 102 has multiple shim tabs 102 stacked together to increase the overall thickness of the corresponding portion of the compound shim 100. In some embodiments, the shim tabs 102-108 are stacked using an adhesive. In other embodiments, the shim tabs 102-108 are joined in a stack with other chemical, mechanical, thermal, or electric adhesion.

In the illustrated embodiment, the shim tabs 102 of the middle stack 102A are shown with their geometries aligned with one another in a uniform stack. In other embodiments, the shim tabs 102 are stacked to achieve a non-uniform stack; for example, stacked in alternating rotational positions. In the illustrated embodiment, the shim tabs 102 of the middle stack 102A are stacked in a linear stack. In other embodiments, the shim tabs 102 have one or more shim tabs 102 that are not linearly stacked. For example, the shim tabs 102 may include one or more shim tabs 102 which engage a proximal stack 104A of shim tabs 104. Linking shim tab stacks may provide structural stability and/or allow for creation of a certain overall geometry in the compound shim 100.

In the illustrated embodiment, the proximal stacks 104A of shim tabs 104 each include, for example, four shim tabs 104 stacked together, while the middle stack 102A of shim tabs 102 includes, for example, six shim tabs 102. In some embodiments, the difference in height between the middle stack 102A of shim tabs 102 and the proximal stack 104A of shim tabs 104 is determined based on the curvature or difference in surface characteristics in the part 110. In another embodiment, the difference in height between the middle stack 102A of shim tabs 102 and the proximal stacks 104A of shim tabs 104 is determined based on a combination of one or more surface characteristics of the first part 110 and one or more surface characteristics of a second part where the first part 110 and the second part are to be joined or are to intersect.

In some embodiments, the shim tabs 104 of the proximal stacks 104A are placed directly adjacent to the shim tabs 102 of the middle stack 102A. In some embodiments, the term "directly adjacent" refers to arranging the shim tabs next to each other to define a gap. In some embodiments, the gap is less than a width of a shim tab. In other embodiments, the gap is sized to accommodate placement of the shim tabs based on the compound shim plan which may be adjusted to a surface characteristic of the first part 110. In some embodiments, the gap is uniform around each shim tab. In other embodiments, the gap varies by location within the compound shim 100.

The illustrated embodiment also includes intermediate stacks 106A of shim tabs 106. While the illustrated embodiment includes two shim tabs 106 layered to form the intermediate stacks 106A, other embodiments include fewer or more shim tabs 106 in each intermediate stack 106A. The illustrated embodiment further includes distal shim tabs 108. In the illustrated embodiment, the distal shim tabs 108 are single unstacked shim tabs applied to the first part 110.

While the illustrated embodiment includes a concentric pattern of shim tabs, other embodiments have other arrangements with different stack thicknesses in different regions of the compound shim 100. In some embodiments, the shim tabs of the compound shim 100 are oriented similarly. In other embodiments, the orientation of at least one shim tab or shim tab stack is different from another shim tab or shim tab stack. In the illustrated embodiment, the compound shim 100 is formed of tessellated shim tabs of a single or similar geometries. In other embodiments, the compound shim 100 is formed using shim tabs having different geometries.

Figure 2:
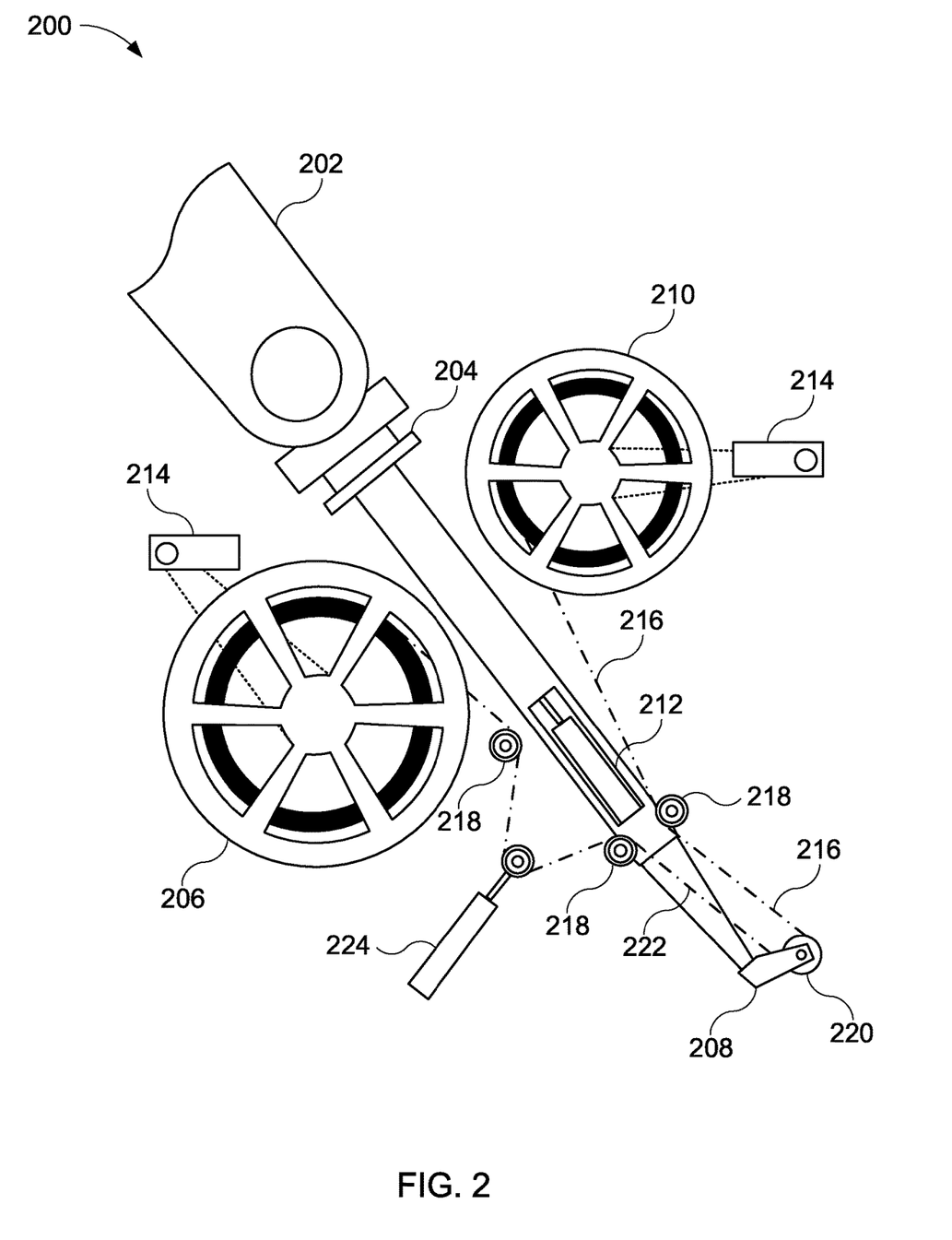
FIG. 2 is a schematic side view of an end-effector arrangement, according to one or more examples of the present disclosure.

FIG. 2 is a schematic view of an end-effector arrangement 200, according to one or more examples of the present disclosure. The end-effector arrangement 200 includes a robotic arm 202 to which an end-effector 204 is coupled. The end-effector 204 includes a supply structure 206, an applicator 208, and a collection structure 210. The robotic arm 202 is capable of positioning the end-effector 204 to apply a shim tab to a part. The robotic arm 202 is capable of movement in one or more directions. Moreover, the robotic arm 202 is numerically or computer controlled.

In some embodiments, the end-effector 204 is capable of movement in one or more directions. In some embodiments, the movement capabilities of the end-effector 204 are complimentary to the movement capabilities of the robotic arm 202. In the illustrated embodiment, the end-effector 204 includes an extension structure 212 to extend a portion of the end-effector 204 relative to the robotic arm 202. The relative extension of a portion of the end-effector 204 is described in greater detail below.

In some embodiments, the end-effector 204 carries shim tabs on the supply structure 206. The supply structure 206 in the illustrated embodiment is a spool with shim tabs contained on the spool. In other embodiments, the supply structure 206 includes a container such as a box, a roll, or other structure capable of storing and handling shim tabs. In the illustrated embodiment, the movement of the supply structure 206 is monitored and/or controlled by a control module 214. In the illustrated embodiment, the control module 214 is coupled to the supply structure 206. In some embodiments, the control module 214 includes a motor to drive the supply structure 206 or measure a displacement of the supply structure 206.

The supply structure 206 is capable of receiving a pre-loaded roll of shim tabs. In another embodiment, the supply structure 206 is capable of winding an organization of shim tabs onto the supply structure 206. Embodiments of the shim tab organization are described in greater detail below with reference to FIGS. 3A and 3B. The supply structure 206 dispenses the shim tabs 216 for application on a part. The end-effector 204 includes guide elements 218. The guide elements 218 align and support the shim tabs 216 from the supply structure 206 to the applicator 208 and from the applicator 208 to the collection structure 210. The guide elements 218 apply tension to the shim tabs 216. The guide elements 218 include wheels or rollers. In other embodiments, the guide elements 218 are non-rolling glide surfaces or channels. Other embodiments of the guide elements 218 include other structures.

The guide elements 218 direct the shim tabs 216 to the applicator 208. The applicator 208 forms a point at which a shim tab is applied to a surface of a part. The applicator 208 includes a wheel or roller 220 to receive the shim tabs 216 and apply a shim tab to a part. The roller 220 may be rigid or flexible. In some embodiments, the roller 220 is capable of deformation to facilitate application of the shim tab to a part. The roller 220 is indexed, in some implementations, for tracking a position of the shim tab relative to the applicator 208.

The applicator 208 is extendable through actuation of the extension structure 212. For example, if the extension structure 212 is actuated, the applicator 208 may be extended away from the robotic arm 202 to apply a shim tab. Other functionality such as rotation and flexure may also be incorporated with the applicator 208 independently or in conjunction with the extension structure 212.

A spent carrier material 222 is returned from the roller 220 to the collection structure 210. The collection structure 210 may be similar to the supply structure 206 described above. The collection structure 210 includes a control module 214, as described above, to control and/or track the movement of the collection structure 210. The carrier material 222 may be a release liner or frame on which the shim tabs are disposed until application of the shim tabs by the applicator 208 to a part. The carrier material 222 is guided by guide element 218 on the way to the collection structure 210. As shown, the end-effector 204 includes a tensioner device 224 to apply tension to the carrier material 222. Other embodiments may include fewer or more components than illustrated.

Figure 3A:
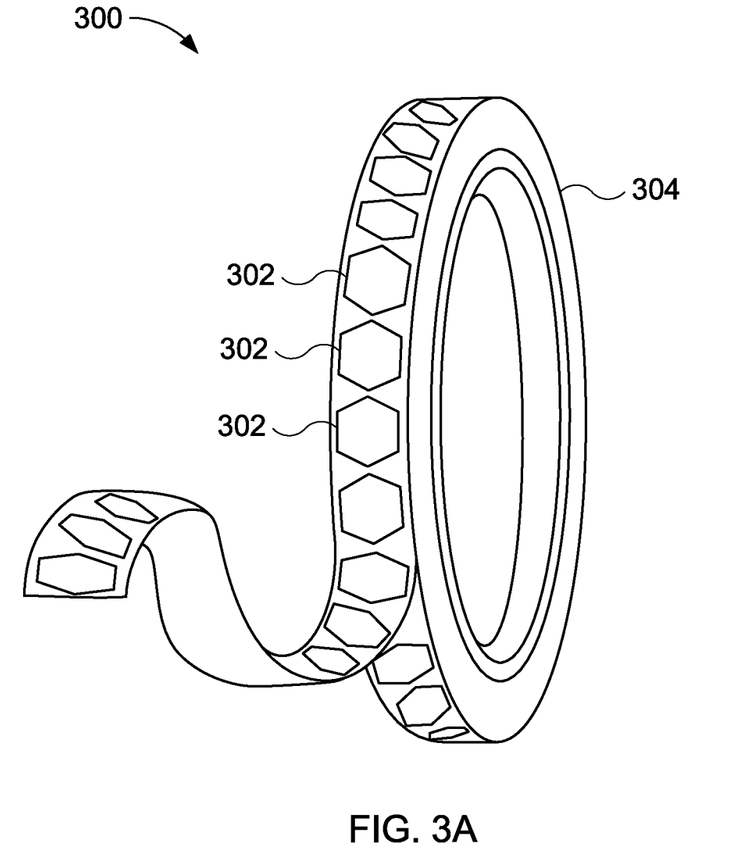
FIG. 3A is a schematic perspective view of a roll of a plurality of shim tabs on a carrier material, according to one or more examples of the present disclosure.

FIG. 3A is a schematic view of a roll 300 of a plurality of shim tabs 302 on a carrier material 304, according to one or more examples of the present disclosure. The shim tabs 302 are disposed on an outer surface of a carrier material 304 that is wound to form the roll 300. The shim tabs 302 include an adhesive or other material to lightly or firmly secure the shim tabs 302 to the carrier material 304. The adhesive or other material to secure the shim tabs 302 is applied to the carrier material 304 prior to or at the time of application of the shim tabs 302 to the carrier material 304.

The shim tabs 302 are formed prior to being applied to the carrier material 304. However, in other embodiments, the shim tabs 302 are formed on the carrier material 304. Some or all of the roll of shim tabs 302 on the carrier material 304 are uniform in shape and size. In other embodiments, one or more of the shim tabs 302 differs in shape or size from another of the shim tabs 302 on the carrier material 304.

In some embodiments, the carrier material 304 has an anti-stick coating or characteristic to facilitate removal of the shim tabs 302 on one or both sides of the carrier material 304. For example, the carrier material 304 may have anti-stick properties on the front of the carrier material to facilitate removal of the shim tabs 302 during application or on the back of the carrier material 304 to reduce sticking of the shim tabs 302 to the backside of the carrier material when wound on the roll 300. In some embodiments, the shim tabs 302 are separated by a gap on the carrier material 304. In other embodiments, the shim tabs 302 are in contact with one another on the carrier material 304.

In the illustrated embodiment, the roll 300 is open at the center to facilitate mounting the roll 300, for example, on a supply structure (e.g., the supply structure 206 of FIG. 2). In other embodiments, the roll 300 has no, or a relatively small, opening at the center. In some embodiments, the roll 300 includes an indexing indicator on the shim tabs 302, the carrier material 304, or other location on the roll 300. In some embodiments, the roll 300 includes perforations, notches, or other physical characteristics to facilitate winding or unwinding of the roll 300 or to apply the shim tabs 302.

Figure 3B:
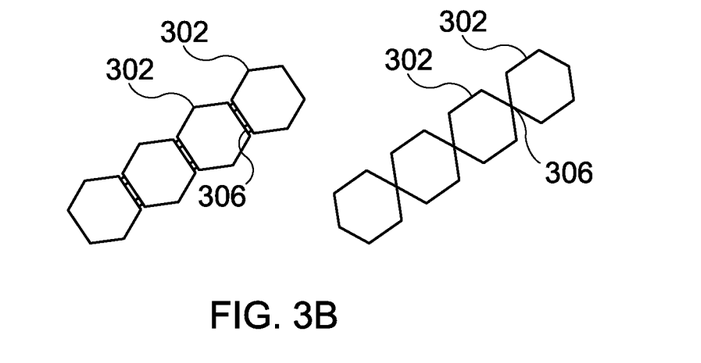
FIG. 3B is a schematic top view of a plurality of unseparated shim tabs, according to one or more examples of the present disclosure.

FIG. 3B is a schematic view of a plurality of unseparated shim tabs 302, according to one or more examples of the present disclosure. In the illustrated embodiments, shim tabs 302 are connected to one another. Connection of the shim tabs 302 facilitates application to or removal from a carrier material. Alternatively, the connection of the shim tabs 302 removes the need for a carrier material (i.e. carrier material 304 of FIG. 3A).

The shim tabs 302 are connected via a connection structure 306. The connection structure 306 may be material added to connect the shim tabs 302 or may be locations on the shim tabs 302 where the material of the shim tabs 302 is connected without additional material. In some embodiments, the connection structure 306 has a reduced thickness or an included weakness to facilitate separation of the shim tabs 302. In some embodiments, the shim tabs 302 are connected at the connection structure 306 on the shim tabs 302 without additional material and supplemented with additional material at other locations.

The shim tabs 302 are aligned on a single plane when connected. In other embodiments, the shim tabs 302 are stacked on an axis that goes through the center of the shim tabs 302. In some embodiments, the shim tabs 302 are oriented at a rotational angle relative to one another. Other arrangements are also contemplated.

Figure 4:
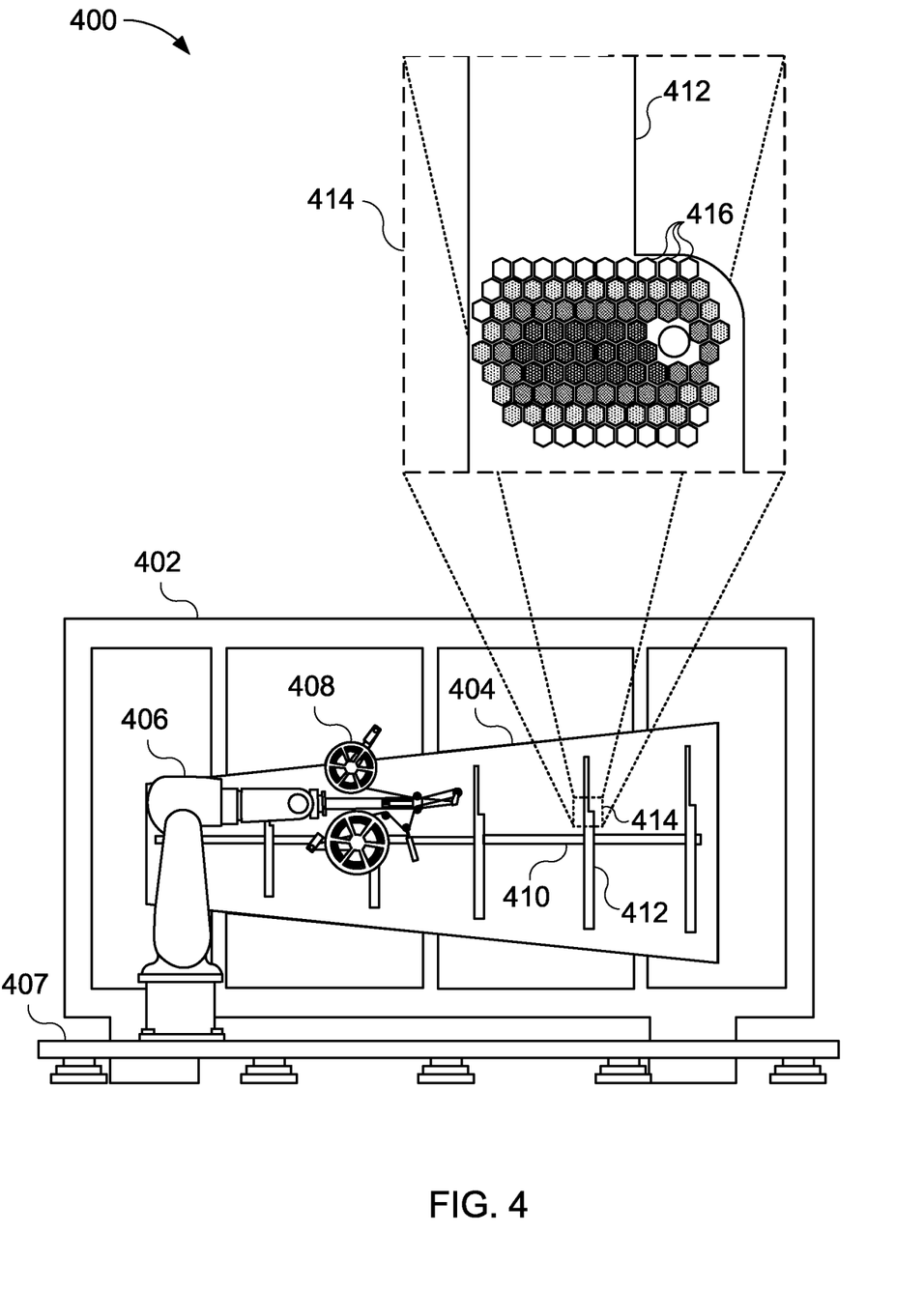
FIG. 4 is a schematic side view of a compound shimming system, according to one or more examples of the present disclosure.

FIG. 4 is a schematic view of a compound shimming system 400, according to one or more examples of the present disclosure. The compound shimming system 400 includes an assembly jig 402 to secure a part 404. The assembly jig 402 is a fixed frame or hanger to which the part 404 is secured. In another embodiment, the assembly jig 402 is a mobile platform capable of orienting the part 404 during assembly. The assembly jig 402 secures the part 404 relative to a multi-axis arm 406. The multi-axis arm 406 includes an end-effector 408. The multi-axis arm 406 moves the end-effector 408 relative to the part 404. The multi-axis arm 406 moves relative to the part via a track 407 or other mobility system. The multi-axis arm 406 may include joints, articulations, or other positioning elements.

The part 404, in the illustrated embodiment, includes a stringer 410 and a rib flange 412 of an aircraft wing. Other embodiments include other types of parts for other systems and structures. The rib flange 412 includes a joining region 414 where the rib flange 412 is secured to the part 404 or another structure. The joining region 414 is shown in a magnified view.

The end-effector 408 applies shim tabs 416 to a location on the part 404. The end-effector 408 applies the shim tabs 416 to the joining region 414. The end-effector 408 applies the shim tabs 416 in a first layer (i.e. a first shim tab 416 at a first location then a second shim tab 416 at a second location adjacent to the first location) and then applies a second layer of shim tabs 416 layered on top of some or all of the shim tabs 416 in the first layer. This process may continue until the desired dimensions are reached for each location in the compound shim applied at the joining region 414 of the part 404. In other embodiments, the shim tabs 416 of a given stack are layered to the prescribed height before forming the next stack of shim tabs 416.

In the illustrated embodiment of the joining region 414 of the part 404, the shim tabs 416 are applied in the vicinity of a fastener location (shown as a round hole amid the shim tabs 416). The fastener location can be a hole or aperture in the joining region 414 to facilitate a fastener to join the part 404 to another part or component. The shim tabs 416 are illustrated with different patterns to indicate different numbers of layers of shim tabs 416 to achieve various thicknesses. As described above, the shim tabs 416 may be layered to achieve a thickness commensurate with a surface characteristic of the part 404 to reduce separation between two parts at the joining region 414.

The end-effector 408 includes an inspection module to determine a surface characteristic of the part 404 at the joining region 414. The inspection module includes an optical, sonic, tactile, or other scanning or imaging device. Furthermore, the inspection module includes an emission component and a sensor component. The emission component emits a signal onto the joining region of the part 404 and a second part to be joined to the part 412. The sensor component receives a reflected emission from the part.

The inspection module sends data corresponding to the surface characteristic of the part to a control module. The control module interprets the data to create a compound shim layout or compound shim plan with a geometry corresponding to joining region and a gap that may be formed by the joining of the part 412 with another part.

Figure 5:
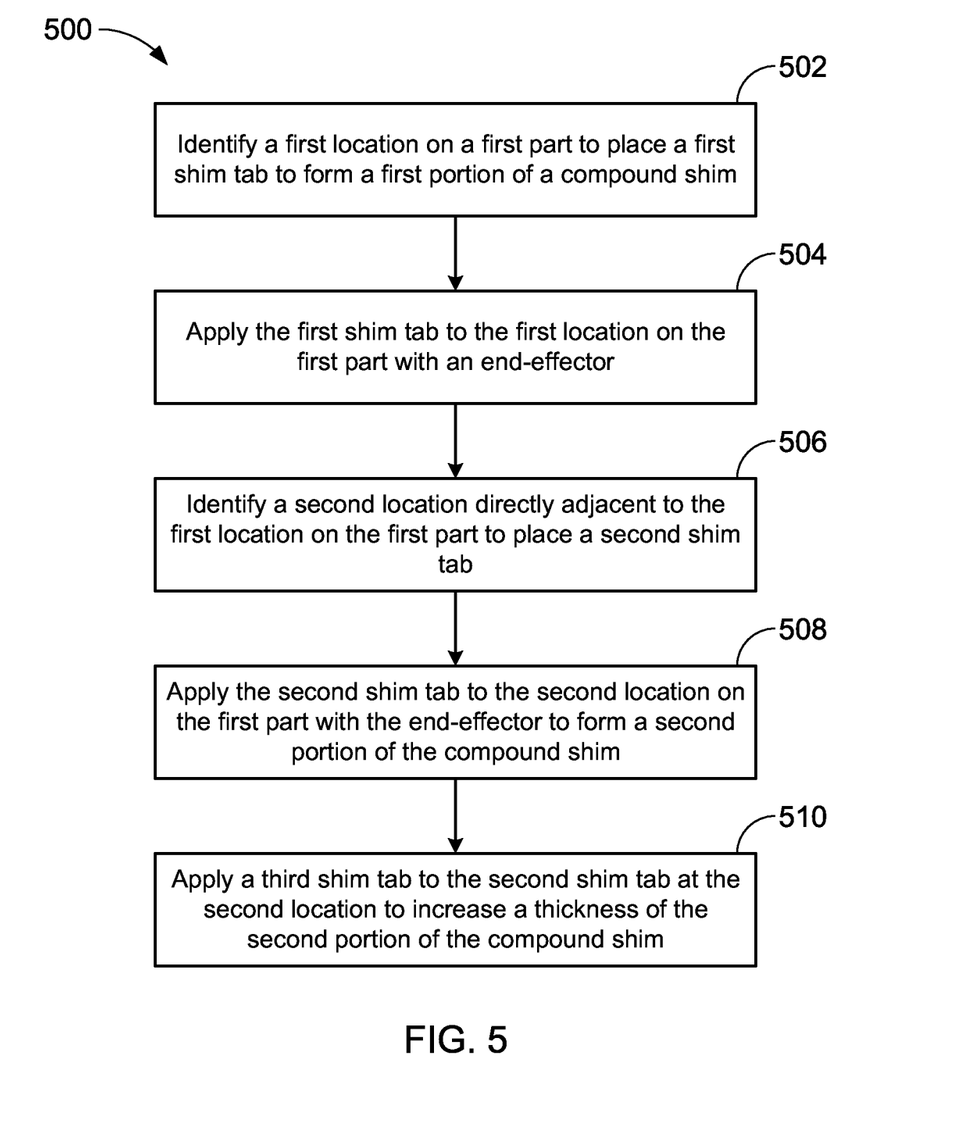
FIG. 5 is a schematic flow diagram of a method, according to one or more examples of the present disclosure.

FIG. 5 is a schematic flow diagram of a method 500, according to one or more examples of the present disclosure. The method 500 includes identifying, at block 502, a first location on a first part to place a first shim tab to form a first portion of a compound shim. In some embodiments, identification of the first location is determined by an assembly plan for the first part. In other embodiments, identification of the first location is determined by scanning the first part.

At block 504, the first shim tab is applied to the first location on the first part with an end-effector. The shim tab may be applied using an adhesive or other tacking material or mechanic. For example, the shim tab may include an adhesive applied to one or both sides of the shim tab to facilitate adhesion at the part. In other embodiments, the shim tab is applied to an adhesive on the surface of the part. In some embodiments, the shim tab is applied to the part and an adhesive or sealant layer is applied over the shim tab or infused into a shim tab stack or compound shim to secure the shim tab to the part. Other manners of securing the shim tab to the part are also contemplated.

At block 506, a second location is identified which is directly adjacent to the first location of the first part to place a second shim tab. In some embodiments, the second location is identified based on a surface characteristic of the first part. In other embodiments, the second location is identified based on a pre-determined distance at which the second shim tab is to be placed from the first shim tab. In some embodiments, the distance is determined by a compound shim plan.

At block 508, the second shim is applied to the second location on the first part with the end-effector to form a second portion of the compound shim. In some embodiments, as described above, the shim tabs are applied by separating each shim tab from a carrier material. In other embodiments, the shim tabs are connected to one another and are separated during or before applying the shim tab. In some embodiments, the end-effector applies the second shim tab in alignment with first shim tab. In some embodiments, the shim tab is applied to an adjusted location based on a detection that the first shim tab is offset from the first location. In other embodiments, the end-effector applies the second shim tab with a gap between the first shim tab and the second shim tab.

At block 510, a third shim tab is applied to the second shim tab at the second location to increase a thickness of the second portion of the compound shim. In some embodiments, the third shim tab includes adhesive on the surface applied to the second shim tab. In some embodiments, the second shim tab includes an adhesive on the surface of the second shim tab to which the third shim tab is applied. In some embodiments, the third shim tab is aligned to match the geometry, and stack on top, of the second shim tab.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent to another element without being in contact with that element.

As used herein, the phrase "at least one of," when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enables the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The schematic flowchart included herein are generally set forth as logical flowchart. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flowchart, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present subject matter may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. A method comprising:
   identifying a first location on a first part to place a first shim tab to form a first portion of a compound shim;
   applying the first shim tab to the first location on the first part with an end-effector;
   identifying a second location directly adjacent, in a direction along the first part, to the first location on the first part to place a second shim tab;
   applying the second shim tab to the second location on the first part with the end-effector to form a second portion of the compound shim; and
   applying a third shim tab to the second shim tab at the second location to stack together the third shim tab and the second shim tab, in a direction away from the first part at the second location, and to increase a thickness of the second portion of the compound shim.

2. The method according to claim 1, wherein the first shim tab and the second shim tab in the compound shim are separated by a gap less than a width of the first shim tab.

3. The method according to claim 1, further comprising determining a surface characteristic of the first part.

4. The method according to claim 3, further comprising determining a surface characteristic of a second part to be joined to the first part and determining a geometry of the compound shim based on the surface characteristic of the first part and the surface characteristic of the second part.

5. The method according to claim 1, wherein applying the first shim tab further comprises removing the first shim tab from a carrier material.

6. The method according to claim 1, further comprising separating the first shim tab from the second shim tab during the application of the first shim tab to the first location with the end-effector.

7. The method according to claim 1, wherein applying the first shim tab further comprises adhering the first shim tab to the first part with an adhesive.

8. The method according to claim 1, wherein the first shim tab and the second shim tab are connected to each other, and the method further comprises disconnecting the first shim tab from the second shim tab before applying the first shim tab and the second shim tab.

9. The method according to claim 1, the first shim tab, the second shim tab, and the third shim tab are automatically applied using a control module.

10. The method according to claim 9, wherein the first shim tab, the second shim tab, and the third shim tab are automatically applied further using an end effector coupled to a multi-axis arm.

11. The method according to claim 1, wherein at least two of the first shim tab, the second shim tab, and the third shim tab have a uniform geometry to facilitate forming a tessellated pattern on the part.

12. The method according to claim 1, wherein the second location is identified after applying the first shim tab to the first location on the first part.

13. The method according to claim 1, wherein identifying the second location comprises adjusting a predetermined location in response to monitoring the application of the first shim tab to the first location on the first part.

14. The method according to claim 1, wherein each of the first shim tab, the second shim tab, and the third shim tab has a polygonal geometry.

15. The method according to claim 1, wherein each of the first shim tab, the second shim tab, and the third shim tab has a hexagonal geometry.

16. The method according to claim 1, further comprising applying the third shim tab to both the second shim tab and the first shim tab.

17. The method according to claim 1, wherein the shapes of the first shim tab, the second shim tab, and the third shim tab are the same.

18. A method comprising:
   identifying a first location on a first part to place a first shim tab to form a first portion of a compound shim;
   applying the first shim tab to the first location on the first part with an end-effector;
   identifying a second location directly adjacent to the first location on the first part to place a second shim tab;
   applying the second shim tab to the second location on the first part with the end-effector to form a second portion of the compound shim;
   applying a third shim tab to the second shim tab at the second location to increase a thickness of the second portion of the compound shim; and
   before applying the first shim tab, the second shim tab, and the third shim tab, receiving the first shim tab, the second shim tab, and the third shim tab from a supply structure carrying the first shim tab, the second shim tab, and the third shim tab on a carrier material and removing the first shim tab, the second shim tab, and the third shim tab from the carrier material.

19. The method according to claim 18, further comprising collecting the carrier material on a collection structure after the first shim tab, the second shim tab, and the third shim tab are removed from the carrier material.

20. The method according to claim 19, wherein at least one of the supply structure and the collection structure comprises a spool.

* * * * *